United States Patent
Chen et al.

(10) Patent No.: US 7,251,301 B2
(45) Date of Patent: Jul. 31, 2007

(54) METHODS AND SYSTEMS FOR PROVIDING A NOISE SIGNAL

(75) Inventors: Fang-Chu Chen, Taipei (TW); Jing-Ling Tsai, Taichung (TW)

(73) Assignee: Industrial Technology Research Institute (TW)

( * ) Notice: Subject to any disclaimer, the term of this patent is extended or adjusted under 35 U.S.C. 154(b) by 839 days.

(21) Appl. No.: 10/262,371

(22) Filed: Oct. 1, 2002

(65) Prior Publication Data

US 2004/0032920 A1 Feb. 19, 2004

Related U.S. Application Data

(60) Provisional application No. 60/402,909, filed on Aug. 14, 2002.

(51) Int. Cl.
*H03D 1/04* (2006.01)

(52) U.S. Cl. .................................................. 375/346

(58) Field of Classification Search ................ 375/316, 375/346, 219, 224, 227
See application file for complete search history.

(56) References Cited

U.S. PATENT DOCUMENTS

| | | | | |
|---|---|---|---|---|
| 5,371,853 A | * | 12/1994 | Kao et al. | 704/200.1 |
| 6,433,726 B1 | * | 8/2002 | Fan | 341/155 |
| 6,766,292 B1 | * | 7/2004 | Chandran et al. | 704/224 |
| 2002/0191804 A1 | * | 12/2002 | Luo et al. | 381/312 |
| 2003/0016731 A1 | * | 1/2003 | Uesugi | 375/130 |
| 2003/0081804 A1 | * | 5/2003 | Kates | 381/316 |

* cited by examiner

*Primary Examiner*—Kevin Burd
(74) *Attorney, Agent, or Firm*—Finnegan, Henderson, Farabow, Garrett & Dunner LLP

(57) ABSTRACT

Providing a noise signal comprises providing a first signal corresponding to a first band of a frequency spectrum of the noise signal and providing a first signal low corresponding to the first band of the freguency spectrum of the noise signal. Next, providing a noise signal comprises providing a second signal corresponding to a second band of the frequency spectrum of the noise signal, the second signal based on the first signal low. And finally, the first signal and the second signal are summed to provide the noise signal.

51 Claims, 10 Drawing Sheets

METHODS AND SYSTEMS FOR PROVIDING A NOISE SIGNAL

RELATED APPLICATION

Under provisions of 35 U.S.C. §119(e), the Applicants claim the benefit of U.S. provisional patent application serial number 60/402,909 entitled HIGH PRECISION DIGITAL $1/f^V$ NOISE GENERATOR, filed Aug. 14, 2002, which is incorporated herein by reference.

TECHNICAL FIELD

The present invention relates to the field of digital noise signals. More particularly, the present invention, in various specific embodiments, involves methods and systems directed to providing a noise signal.

BACKGROUND

Noises may be characterized as sounds that are not pleasant to human ears. Among the noises, white noise is often used as a simulation source in the engineering field due to its uniformly distributed power density in the frequency domain. Pink noise, on the other hand, is often used as a source for frequency response measurements on stereo systems. Instead of being flat in the linear frequency domain, pink noise, as opposed to white noise, has energy uniformly distributed over octaves. More specifically, the total energy of each pink noise octave has substantially the same value over a given frequency range, for example, 20 Hz to 20 kHz. This resembles the psycho-acoustic model of human hearing, specifically, as the frequency increases, the ear is less sensitive to the frequency change by, for example, a factor of 2.

There are generally two methods for generating pink noise in real time that are conventionally focused on time domain processing; 1) filtering white noise and 2) the Voss algorithm. The filtering white noise method generates a white noise signal using random number generators and then passes the white noise through a low pass filter. The disadvantage of this method is that a low pass filter with a proper frequency response is very difficult to construct. Therefore, the quality of the pink noise generated by this method may largely depend on how well the filter is designed. Because it is difficult to construct a suitable digital filter operating in the time domain, a pink noise generated by this method is problematic.

Another method uses the Voss algorithm. This is a very well known method that also starts with white noise generated by some random number generator. White noise generated for different octaves are then added together to yield a signal very close to a pink noise signal. Using this method, however, a 1 db deviation from the perfect pink noise spectrum may be created that cannot be eliminated no matter how many octaves or samples are used.

Besides the aforementioned problems, there is another disadvantage in using the methods described above. For both methods, because the signal is generated by random process, a very large sample space is needed to show the expected statistical behavior. Specifically, in order to get a good measurement, the source must generate for a long time in order to produce a satisfactory pink noise

SUMMARY OF THE INVENTION

Consistent with the present invention, methods and systems for providing a noise signal are provided that avoid problems associated with prior methods and systems for providing a noise signal as discussed herein above.

In one aspect, a method for providing a noise signal comprises providing a first signal corresponding to a first band of a frequency spectrum of the noise signal, providing a first signal low corresponding to the first band of the frequency spectrum of the noise signal, providing a second signal corresponding to a second band of the frequency spectrum of the noise signal, the second signal based on the first signal, and summing the first signal and the second signal to provide the noise signal.

In another aspect, a system for providing a noise signal comprises a component for providing a first signal corresponding to a first band of a frequency spectrum of the noise signal, a component for providing a first signal low corresponding to the first band of the frequency spectrum of the noise signal, a component for providing a second signal corresponding to a second band of the frequency spectrum of the noise signal, the second signal based on the first signal low, and a component for summing the first signal and the second signal to provide the noise signal.

In yet another aspect, a computer-readable medium on which is stored a set of instructions for providing a noise signal, which when executed perform stages comprising providing a first signal corresponding to a first band of a frequency spectrum of the noise signal, providing a first signal low corresponding to the first band of the frequency spectrum of the noise signal, providing a second signal corresponding to a second band of the frequency spectrum of the noise signal, the second signal based on the first signal low, and summing the first signal and the second signal to provide the noise signal.

Both the foregoing general description and the following detailed description are exemplary and are intended to provide further explanation of the invention as claimed.

BRIEF DESCRIPTION OF THE DRAWINGS

The accompanying drawings provide a further understanding of the invention and, together with the detailed description, explain the principles of the invention. In the drawings.

DETAILED DESCRIPTION

Figure 1:
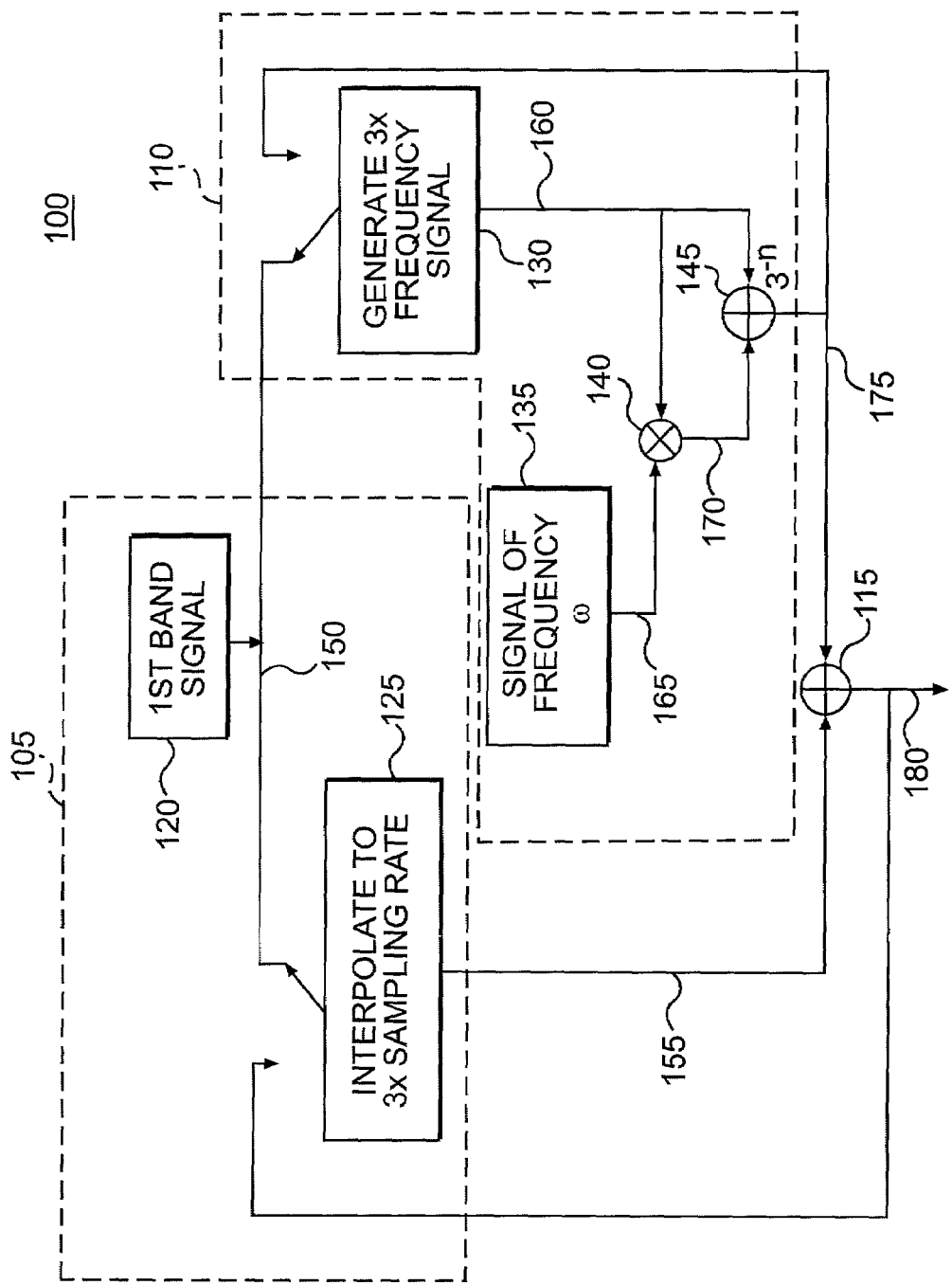
FIG. 1 is a functional block diagram of a system for providing a noise signal consistent with an embodiment of the present invention.

Reference will now be made to various embodiments according to this invention, examples of which are shown in the accompanying drawings and will be obvious from the description of the invention. In the drawings, the same reference numbers represent the same or similar elements in the different drawings whenever possible.

Consistent with the general principles of the present invention, a system for providing a noise signal comprises a component for providing a first signal corresponding to a first band of a frequency spectrum of the noise signal, a component for providing a first signal low corresponding to the first band of the frequency spectrum of the noise signal, a component for providing a second signal corresponding to a second band of the frequency spectrum of the noise signal, the second signal based on the first signal low, and a component for summing the first signal and the second signal to provide the noise signal.

The component for providing the first signal, the component for providing the second signal, and the component for summing may comprise elements of, be disposed within, or may otherwise be utilized by or embodied within a mobile phone, a personal computer, a hand-held computing device, a multiprocessor system, microprocessor-based or programmable consumer electronic device, a minicomputer, a mainframe computer, a personal digital assistant (PDA), a facsimile machine, a telephone, a pager, a portable computer, or any other device that may receive, transmit, and/or process information. The above list of devices are exemplary and the component for providing the first signal, the component for providing the second signal, and the component for summing may comprise elements of, be disposed within, or may otherwise be utilized by or embodied within many other devices or system without departing from the scope and spirit of the invention.

As herein embodied and illustrated in FIG. 1, the system for providing a noise signal may comprise a noise providing system 100. The elements of system 100 will be described in greater detail below. Consistent with an embodiment of the invention, the component for providing a first signal corresponding to a first band of a frequency spectrum of the noise signal may comprise a first signal component 105, the component for providing a second signal corresponding to a second band of the frequency spectrum of the noise signal may comprise a second signal component 110, and the component for summing the first signal and the second signal to provide the noise signal may comprise a summer 115. First signal component 105 may comprise a first signal low component 120 for providing a first signal low 150 and an up-sampling component 125 for providing a first signal 155.

Second signal component 110 may comprise a repeat signal component 130 for providing a repeat signal 160, a signal generating component 135 for providing a single frequency 165, a multiplier 140 for providing a fill-in signal 170, and a summer 145 for providing a second signal 175 using repeat signal 160 and fill-in signal 170. Summer 115 may provide a noise signal 180 by summing first signal 155 and second signal 175. The aforementioned elements and components of system 100 are exemplary and other elements may comprise, for example, the component for providing a first signal, the component for providing a second signal, the component for summing, or any sub-components or element thereof without departing from the spirit of the invention.

White noise and pink noise may share common frequency functions with different exponents, as follows:

$$\mathrm{mag}(f) = \frac{1}{f^n} \quad (1)$$

or $$\mathrm{power}(f) = \frac{1}{f^{2n}} \quad (2)$$

In the above equations (1) and (2), mag(f) and power(f) are the magnitude and the power of the frequency component at frequency f respectively. The magnitude and power spectrum density for white noise may correspond to the case when n=0 and the magnitude and power spectrum density for pink noise may correspond to the case when n=0.5.

Because a desired spectrum of noise signal 180 may be known, noise signal 180 may be designed in the frequency domain. Specifically, noise signal 180 may be designed by adding the frequency components whose magnitudes follow the relationship of equation (1) or (2) with a corresponding value of n, and then transforming this spectrum into the time domain signal by Fourier transform. However, for a frequency range from 20 Hz to 20 kHz and with a frequency bin of about 1 Hz, at least a 20,000 point Fourier transform may be necessary, which is very computational intensive and memory consuming. Embodiments of the present invention may go between the frequency and time domains in order to provide a method that may include substantial precision, but with much less computation.

Consistent with embodiments of the present invention, the spectrum of interest may be separated into bands, each band may have its highest frequency three times greater than its lowest frequency. The signal corresponding to the lowest band may be designed in the frequency domain and then transformed into the time domain by a low sampling rate transform. Higher bands may then be designed in the time domain using the signal corresponding to the lowest band according to the procedures described below.

Consistent with an embodiment of the present invention the first band and the second band may be contiguous in the frequency domain and may include an upper boundary of the first band three times greater than a lower boundary of the first band in the frequency domain. In addition, an upper boundary of the second band may be three times greater than a lower boundary of the second band in the frequency domain. And a frequency range of the second band may be three times larger than a frequency range of the first band. Moreover, the noise signal may comprise one of a white noise signal or a pink noise signal, however, embodiments of the present invention are not limited to any particular type of noise.

Figure 2:
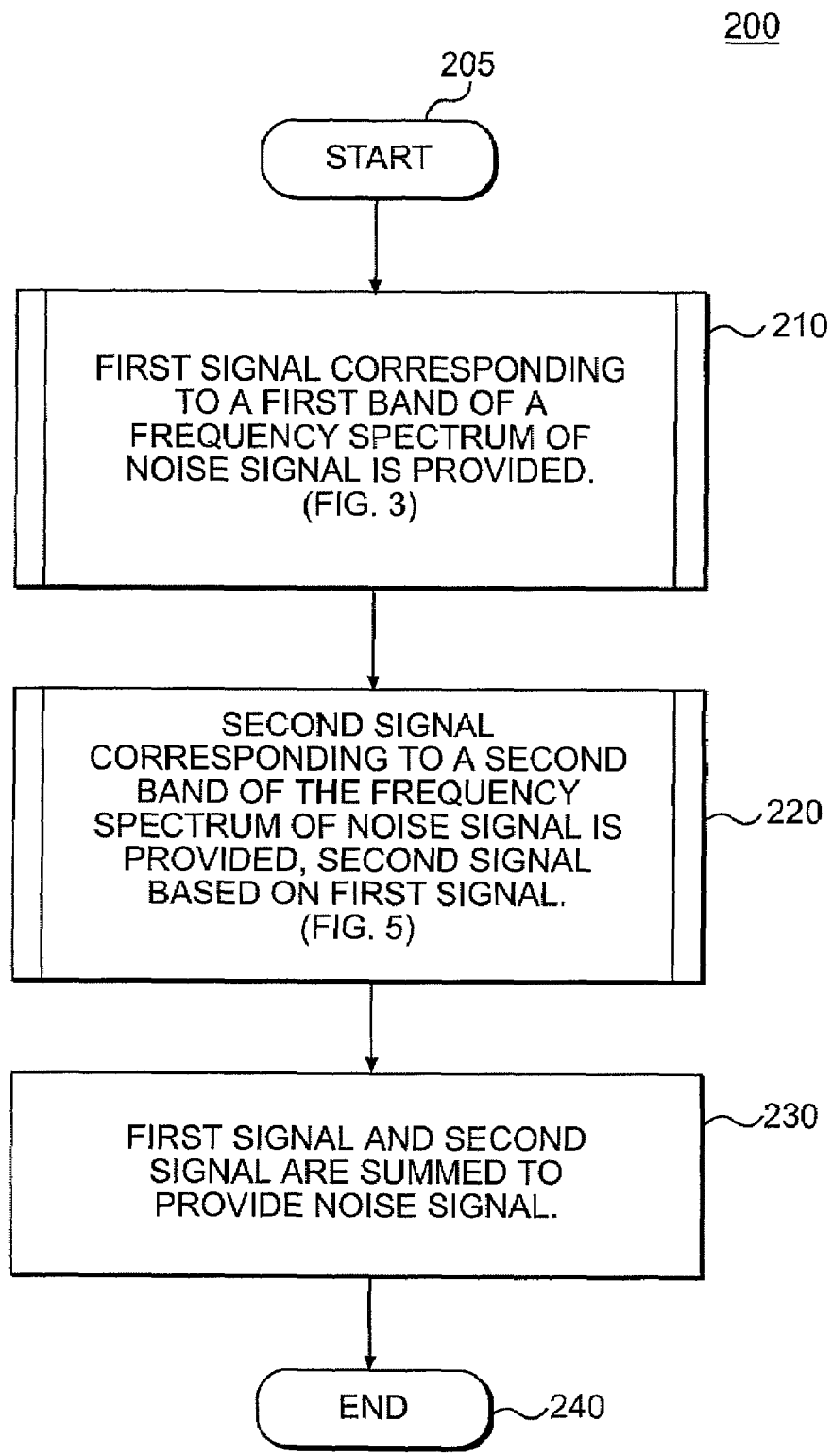
FIG. 2 is a flow chart of an exemplary method for providing a noise signal consistent with an embodiment of the present invention.
Figure 3:
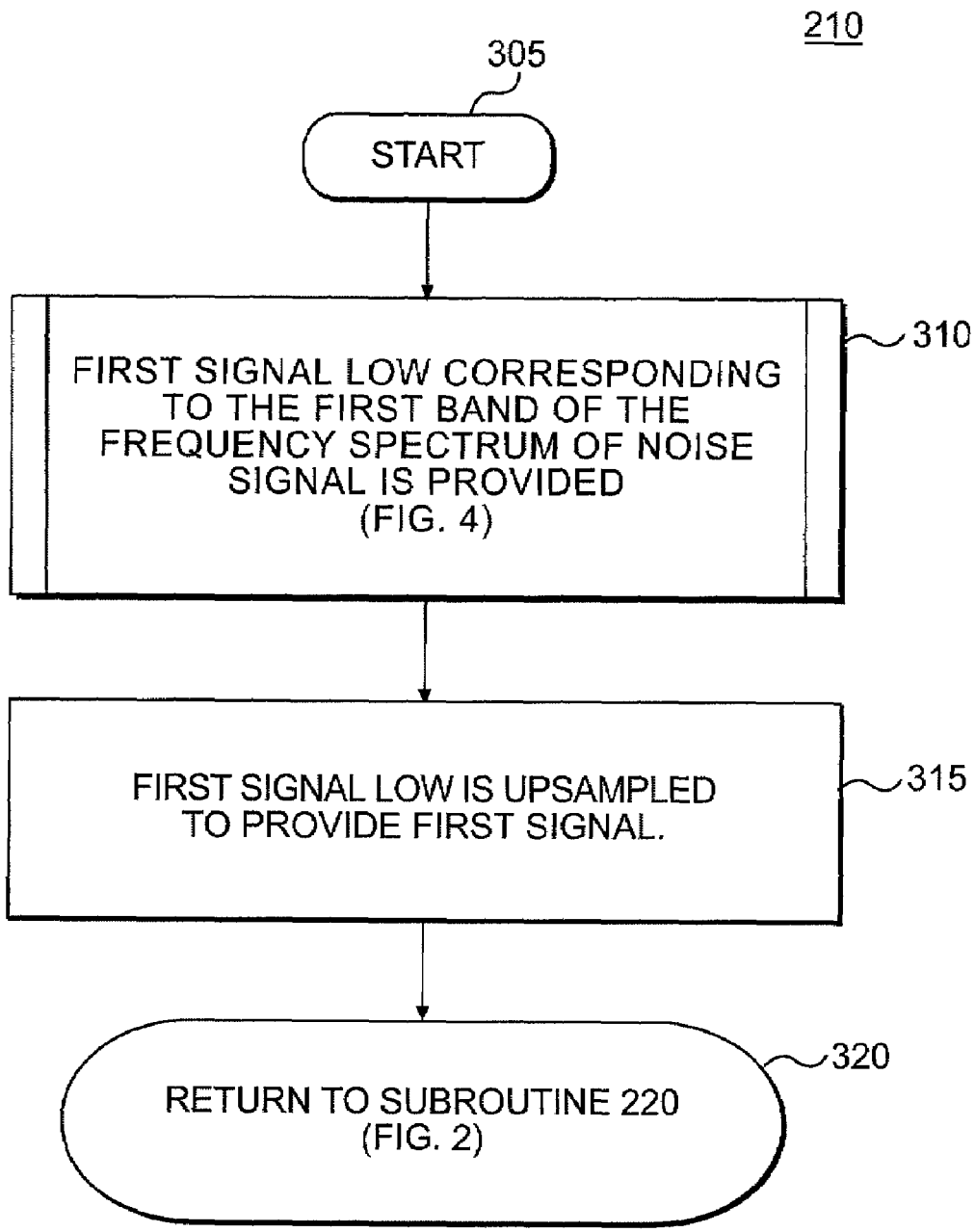
FIG. 3 is a flow chart of an exemplary subroutine used in the exemplary method of FIG. 2 for providing the first signal corresponding to the first band of the frequency spectrum of the noise signal consistent with an embodiment of the present invention.

FIG. 2 is a flow chart setting forth the general stages involved in an exemplary method 200 for providing a noise signal consistent with an embodiment of the present invention. The system for providing a noise signal may comprise system 100 of FIG. 1, for example. The implementation of the stages of exemplary method 200, in accordance with exemplary embodiments of the present invention, will be described in greater detail in FIGS. 3 through 5. Exemplary method 200 begins at starting block 210 and proceeds to exemplary subroutine 210 where first signal 155 corresponding to the first band of the frequency spectrum of noise signal 180 is provided. The stages of exemplary subroutine 210 are shown in FIG. 3 and will be described in greater detail below.

Figure 5:
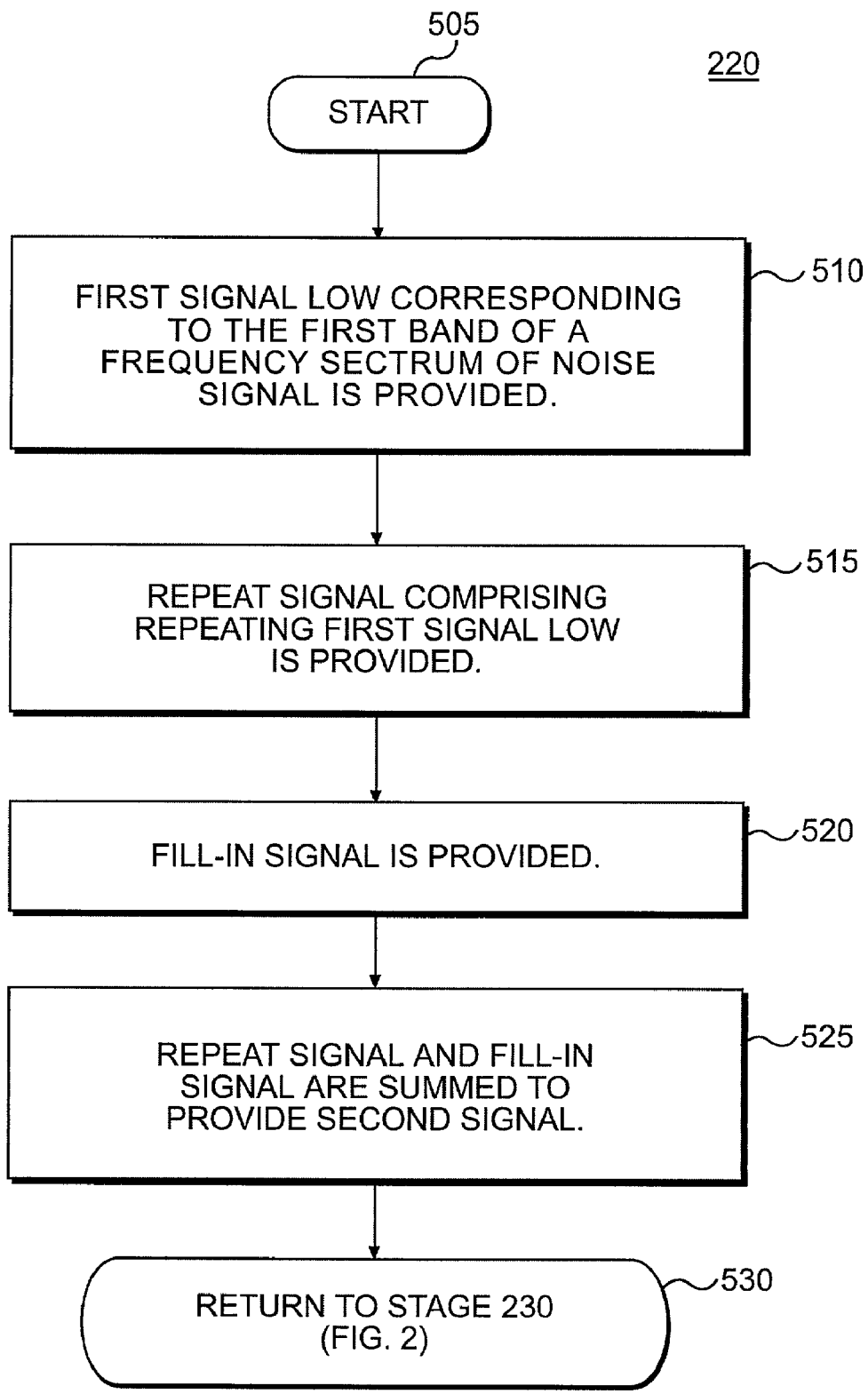
FIG. 5 is a flow chart of an exemplary subroutine used in the exemplary method of FIG. 2 for providing the second signal corresponding to the second band of the frequency spectrum of the noise signal consistent with an embodiment of the present invention.

From exemplary subroutine 210 where first signal 155 corresponding to the first band of the frequency spectrum of noise signal 180 is provided, exemplary method 200 advances to exemplary subroutine 220 where second signal 175 corresponding to the second band of the frequency spectrum of noise signal 180 is provided, second signal 175 based on first signal low 150. The stages of exemplary subroutine 220 are shown in FIG. 5 and will be described in greater detail below.

Figure 9:
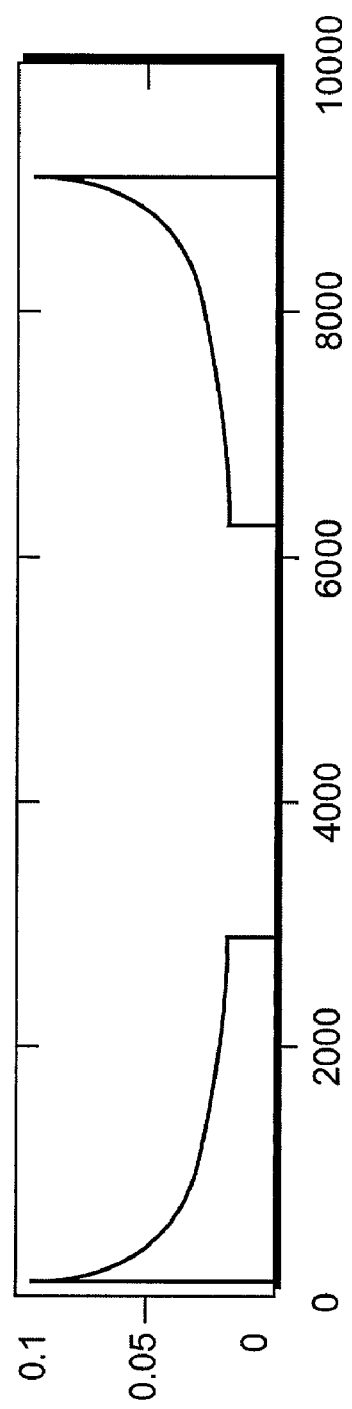
FIG. 9 is an illustration of the spectrum of the noise signal consistent with an embodiment of the present invention.

After second signal 175 corresponding to the second band of the frequency spectrum of noise signal 180 is provided in exemplary subroutine 220, second signal 175 being based on first signal low 150, exemplary method 200 continues to stage 230 where first signal 155 and second signal 175 are summed, using summer 115, for example, to provide noise signal 180. For example, noise signal 180 up to the second band is shown in FIG. 9. Once first signal 155 and second signal 175 are summed to provide noise signal 180 in stage 230, exemplary method 200 ends at stage 240.

Figure 10:
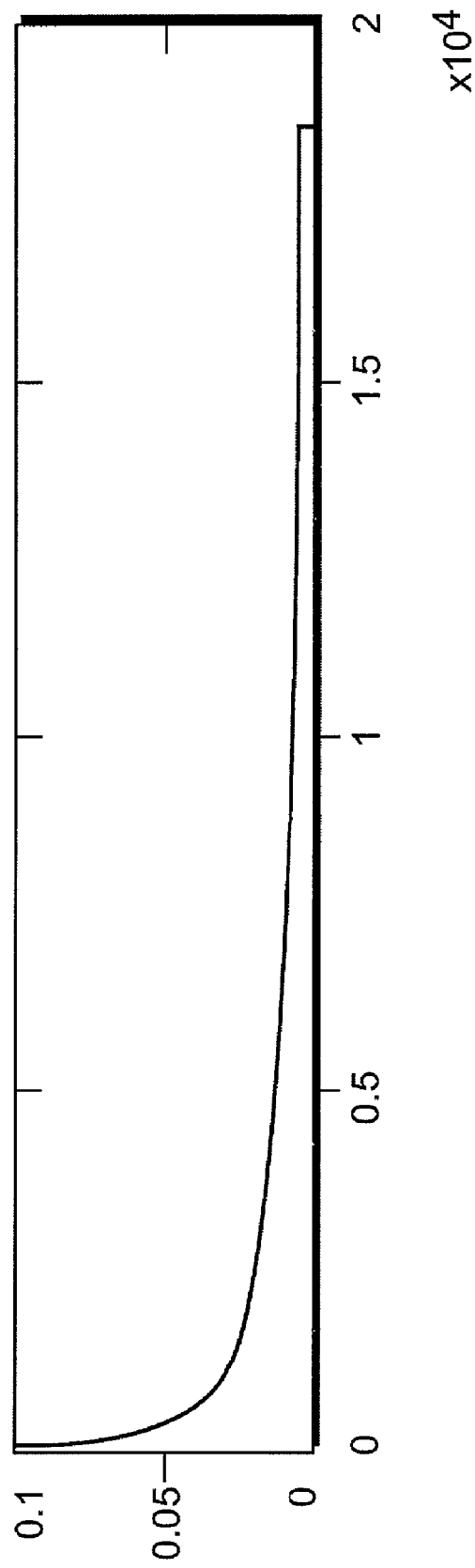
FIG. 10 is an illustration of the spectrum of five bands consistent with an embodiment of the present invention.

The frequency spectrum of noise signal 180 may be divided into more than two bands. To add more bands, the process of FIG. 2 may be repeated with the input of up-sampling component 125 being noise signal 180 rather than first signal low 150 as is the case with just two bands. FIG. 10 shows 5 bands of a generated pink noise spectrum, for example. Note that for the purpose of fast computation, the total sampling rate is different from that used in FIG. 6 through FIG. 9. The result, however, is not affected. Also, in FIG. 10, only positive frequencies are shown.

Figure 11:
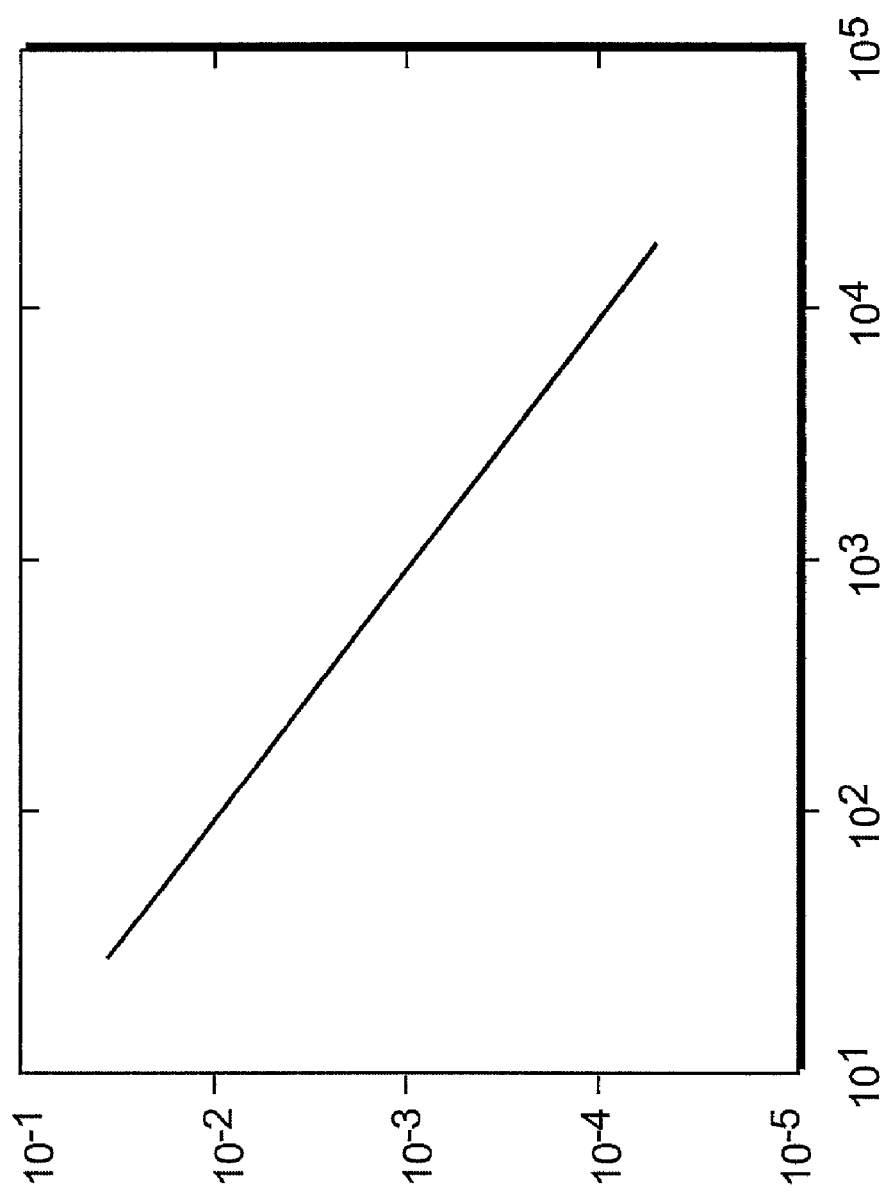
FIG. 11 is an illustration of a log-log plot of the spectrum of FIG. 10 consistent with an embodiment of the present invention.

FIG. 11 shows a log-log plot of the spectrum of FIG. 10 and illustrates that the spectrum shown follows one indicative of a pink noise signal. It can be seen that the function of FIG. 11 is substantially equal to equation (1) with n=0.5.

Figure 12:
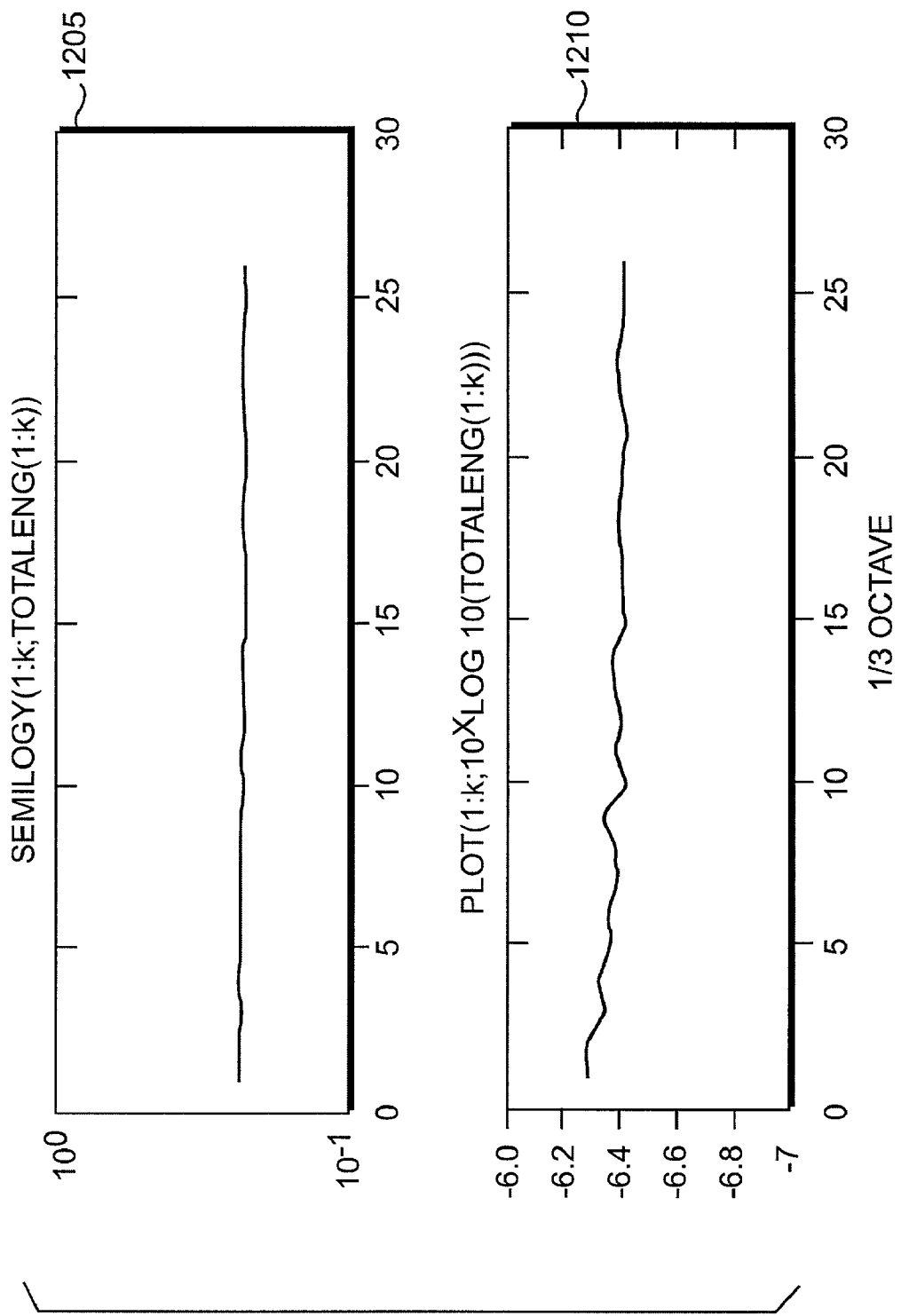
FIG. 12 is an illustration of the ⅓ octave plot for the spectrum of FIG. 10 consistent with an embodiment of the present invention.

Another way to look at the results is by a ⅓ octave plot, for example, to plot the total energy for each ⅓ octave. Because the case where n=0.5 (pink noise) is plotted, the total energy in each ⅓ octave should be substantially the same. FIG. 12 shows the ⅓ octave plot for the signal of FIG. 10. The top subplot 1205 of FIG. 12 shows the log values of the total energy verses the ⅓ octave number. The bottom subplot 1210 shows the dB values of the total energy verses the ⅓ octave number. From the dB plot it can be seen that the method of FIG. 2 for pink noise introduces only about +−0.1 dB distortion in the final result.

Figure 4:
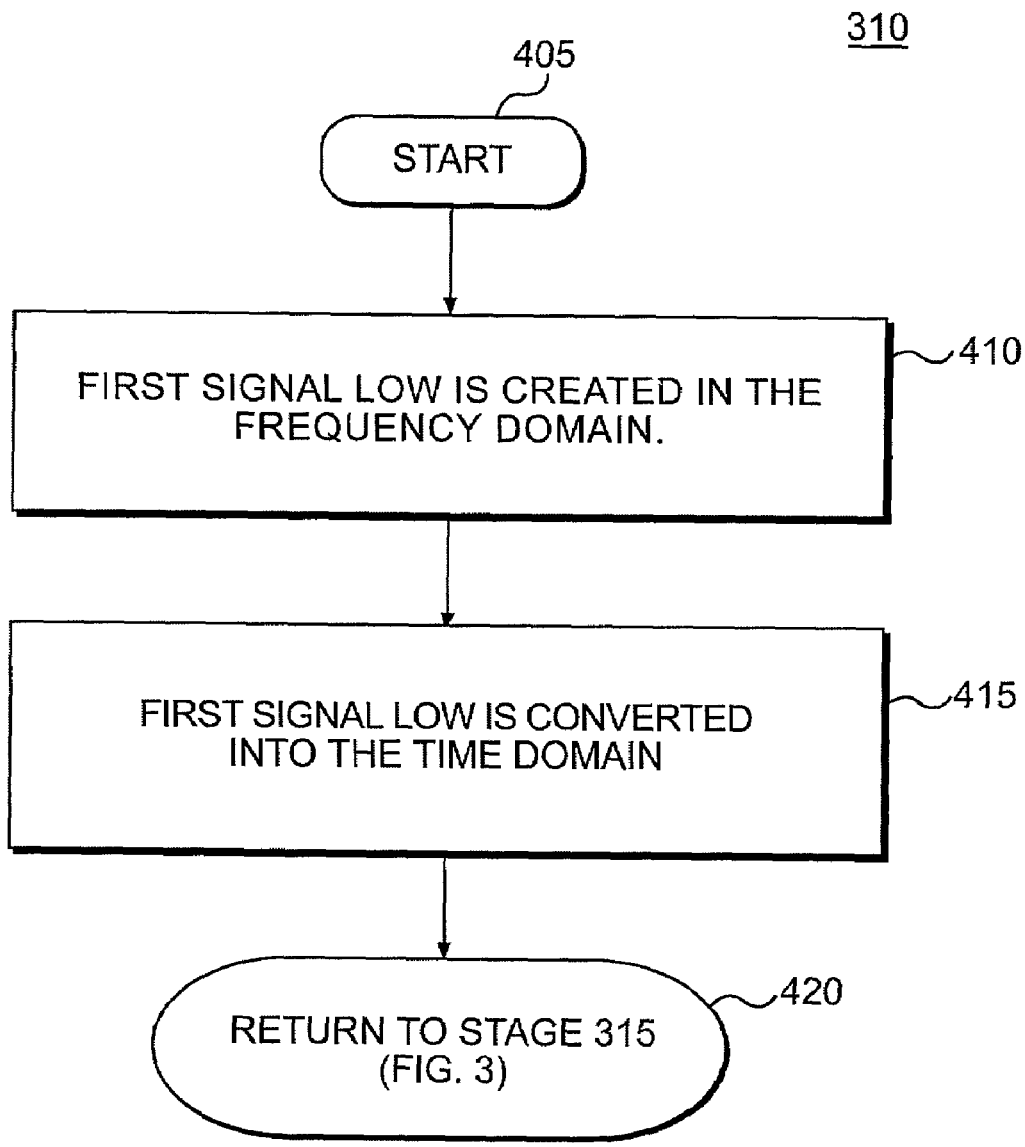
FIG. 4 is a flow chart of an exemplary subroutine used in the exemplary subroutine of FIG. 3 for providing the first signal low corresponding to the first band of the frequency spectrum of the noise signal consistent with an embodiment of the present invention.

FIG. 3 describes exemplary subroutine 210 from FIG. 2 for providing first signal 155 corresponding to the first band of the frequency spectrum of noise signal 180. Exemplary subroutine 210 begins at starting block 305 and advances to exemplary subroutine 310 where first signal low 150 corresponding to the first band of the frequency spectrum of noise signal 180 is provided. The stages of exemplary subroutine 310 are shown in FIG. 4 and will be described in greater detail below.

After first signal low 150 corresponding to the first band of the frequency spectrum of noise signal 180 is provided in stage 310, exemplary subroutine 210 continues to stage 315 where first signal low 150 is up-sampled to provide first signal 155. Because repeat signal 160 may be created by repeating first signal low 150 three times (as described below) and then played back in the same time period as first signal low 150, the sampling rate of repeat signal 160 may be set three time greater than that of first signal low 150. To be consistent, first signal low 150 may be up-sampled by a factor of three, for example, by adding two interpolated points between two adjacent sampled points. One way to perform up-sampling is by using an interpolation filter with the discrete Sinc function. For example, an interpolation filter may be used in conjunction with up-sampling component 125. The interpolation filter may utilizes at least one of the following relations.

$$h_1(n) = \sin(\pi((1/3)-n))/\pi((1/3)-n); \text{ and}$$

$$h_2(n) = \sin(\pi((2/3)-n))/\pi((2/3)-n).$$

In the above relations, $h_1(n)$ may be used to generate a first interpolation point and $h_2(n)$ may be used to generate a second interpolation point. Once first signal low 150 is up-sampled to provide first signal 155 in stage 315, exemplary subroutine 210 continues to stage 320 and returns to subroutine 220 of FIG. 2.

FIG. 4 describes exemplary subroutine 310 from FIG. 3 for providing first signal low 150 corresponding to the first band of the frequency spectrum of noise signal 180. Exemplary subroutine 310 begins at starting block 405 and advances to stage 410 where first signal low 150 is created in the frequency domain. For example, creating first signal low 150 in the frequency domain may comprise utilizing at least one equation (1) and (2) where mag(f) and power(f) (as described above) are a magnitude and a power of a frequency component at frequency f respectively. Specifically, noise signal 180 may be a white noise signal if n=0 or may be a pink noise signal if n=0.5.

Figure 6:
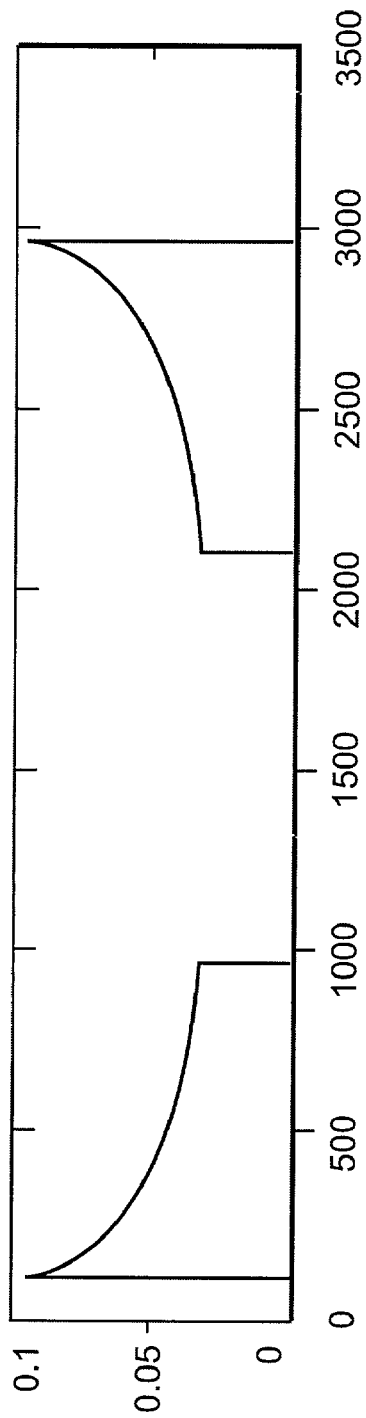
FIG. 6 is an illustration of a sample of the spectrum of the first signal low consistent with an embodiment of the present invention.

After first signal low 150 is created in the frequency domain in stage 410, exemplary subroutine 310 continues to stage 415 where first signal low 150 is converted into the time domain. For example, a Fourier transform may be used in converting the first signal low into the time domain. FIG. 6 shows a sample of the spectrum of first signal low 150. Once first signal low 150 is converted into the time domain in stage 415, exemplary subroutine 310 continues to stage 420 and returns to stage 315 of FIG. 3.

FIG. 5 describes exemplary subroutine 220 from FIG. 2 for providing second signal 175 corresponding to the second band of the frequency spectrum of noise signal 180, second signal 175 based on first signal low 150. Exemplary subroutine 220 begins at starting block 505 and advances to stage 510 where first signal low 150 corresponding to the first band of the frequency spectrum of noise signal 180 is provided. For example, providing first signal low may comprise creating first signal low 150 in the frequency domain and converting first signal low 150 into the time domain as described above with respect to exemplary subroutine 310 of FIG. 4.

Figure 7:
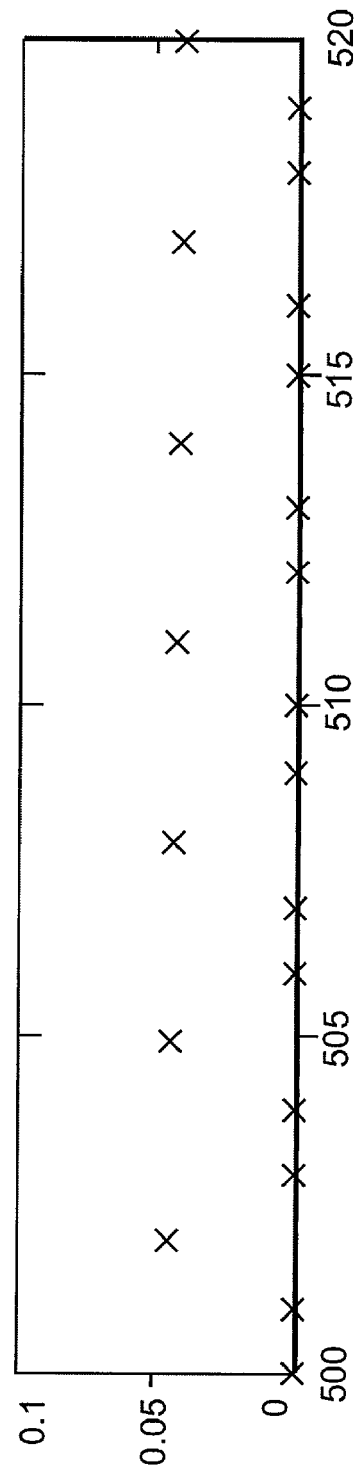
FIG. 7 is an illustration of components in the first band that have zero magnitudes consistent with an embodiment of the present invention.
Figure 8:
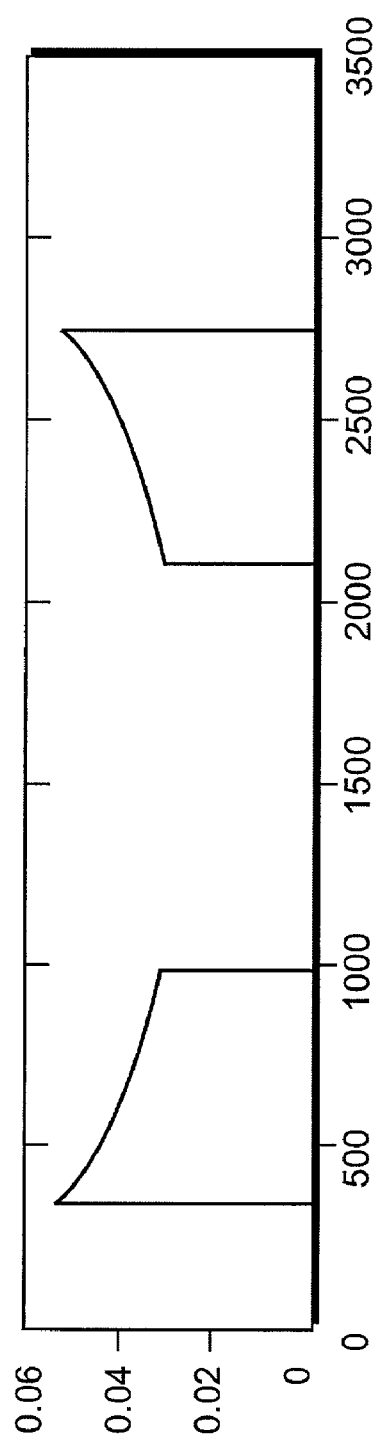
FIG. 8 is an illustration of the spectrum of the second signal consistent with an embodiment of the present invention.

From stage 510 where first signal low 150 corresponding to the first band of the frequency spectrum of noise signal 180 is provided, exemplary subroutine 220 advances to stage 515 where repeat signal 160 comprising repeating first signal low 150 is provided. For example, the second band frequency range may be three times larger than the frequency range of the first band with its lower boundary coinciding with the upper boundary of the first band. Because the spectrum of second signal 175 may comprise a similar shape as first signal low 150, second signal 175 may be generated using the time domain signal of first signal low 150. Generally, the same waveform is repeated in second signal 175, but with a reduce time period of each frequency component by a factor of three. The actual processing may comprise using repeat component 130 to repeat the waveform of first signal low 150 three times to get repeat signal 160. Repeat signal 160, when played back in the same time period as the first band, may have frequency components at the frequency values three times those of first signal low 150. However, repeat signal 160 is not the final signal needed. Because the frequency range is three time larger, those frequency components that have no corresponding components in the first band may have zero magnitudes, as shown in FIG. 7.

After repeat signal 160 comprising repeating first signal low 150 is provided in stage 515, exemplary subroutine 220 continues to stage 520 where fill-in signal 170 is provided. For example, providing the fill-in signal may comprise multiplying repeat signal 160 by single frequency signal 165, which may include only the frequency corresponding to the frequency of the value equal to the frequency spacing of the second band signal. Before the multiplication, there may be two zero-value components between two adjacent nonezero components, or the in form of S (repeat signal) $(i)=0$ i≠3n S (repeat signal) $(i)≠i=3n$ One way to fill-in the zero-value components is to multiply repeat signal 160 by single frequency signal 165 containing only the frequency of the value equal to the frequency spacing of the second band signal, for example, z=Σrepeat signal $(i)$ ssstime $(i)$ where ssstime is the above mentioned single frequency signal and z is fill-in signal 170.

By trigonometry, this direct multiplication of repeat signal 160 with ssstime may generate frequency components at i=3n+1 and 3n−1 with the same magnitude as that at i=3n. These components may be those that are lacking in repeat signal 160.

Once fill-in signal 170 is provided in stage 520, exemplary subroutine 220 continues to stage 525 where repeat signal 160 and fill-in signal 170 are summed by summer 145 to provide second signal 175. For example, summing repeat signal 160 and fill-in signal 170 to provide second signal 175 may comprise scaling second signal 175 by a factor to match the spectrum of first signal 155. The scaling factor may comprise $3^{-n}$ in order to match the spectrum in the first band. Thus, second signal 175 may be represented by the following equation with its corresponding exemplary spectrum shown in FIG. 8.

second signal=$3^{-n}$ (fill-in signal+repeat signal)

After repeat signal 160 and fill-in signal 170 are summed to provide second signal 175 in stage 525, exemplary subroutine 220 continues to stage 530 and returns to stage 230 of FIG. 2.

It will be appreciated that a system in accordance with an embodiment of the invention can be constructed in whole or in part from special purpose hardware or a general purpose computer system, or any combination thereof. Any portion of such a system may be controlled by a suitable program. Any program may in whole or in part comprise part of or be stored on the system in a conventional manner, or it may in whole or in part be provided in to the system over a network or other mechanism for transferring information in a conventional manner. In addition, it will be appreciated that the system may be operated and/or otherwise controlled by means of information provided by an operator using operator input elements (not shown) which may be connected directly to the system or which may transfer the information to the system over a network or other mechanism for transferring information in a conventional manner.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for providing a noise signal comprising:
providing a first signal low, corresponding to a first band of a frequency spectrum of the noise signal, by creating the first signal low in the frequency domain and converting the first signal low into the time domain;
providing a first signal, corresponding to the first band of the frequency spectrum of the noise signal, by up-sampling the first signal low;
providing a second signal corresponding to a second band of the frequency spectrum of the noise signal, the second signal based on the first signal low; and
summing the first signal and the second signal to provide the noise signal.

2. The method of claim 1, wherein up-sampling the first signal low comprises using an interpolation filter.

3. The method of claim 2, wherein the interpolation filter utilizes at least one of the relations:

$h_1(n)=\sin(\pi((\frac{1}{3})-n))/\pi((\frac{1}{3})-n)$ $h_2(n)=\sin(\pi((\frac{2}{3})-n))/\pi((\frac{2}{3})-n);$ and wherein $h_1(n)$ is used to generate a first interpolation point and $h_2(n)$ is used to generate a second interpolation point.

4. The method of claim 1, wherein creating the first signal low in the frequency domain comprises utilizing at least one of the relations:

$mag(f)=1/f^n$, and $power(f)=1/f^{2n}$; and wherein mag(f) and power(f) are a magnitude and a power of a frequency component at frequency f respectively.

5. The method of claim 4, wherein the noise signal is a white noise signal if n=0.

6. The method of claim 4, wherein the noise signal is a pink noise signal if n=0.5.

7. The method of claim 1, wherein a Fourier transform is used in converting the first signal low into the time domain.

8. The method of claim 1, wherein providing the second signal comprises creating the second signal in the time domain using the first signal low.

9. The method of claim 8, wherein creating the second signal in the time domain using the first signal low comprises:
   providing the first signal low corresponding to the first band of a frequency spectrum of the noise signal;
   providing a repeat signal comprising repeating the first signal low;
   providing a fill-in signal; and
   summing the repeat signal and the fill-in signal to provide the second signal.

10. The method of claim 9, wherein providing the fill-in signal comprises multiplying the repeat signal by a single frequency signal, the single frequency signal including only the frequency corresponding to the lowest frequency of the second band.

11. The method of claim 9, wherein summing the repeat signal and the fill-in signal to provide the second signal comprises scaling the second signal by a factor to match the spectrum of the first signal.

12. The method of claim 11, wherein the factor comprises $3^{-n}$.

13. The method of claim 1, wherein the first band and the second band are contiguous in the frequency domain.

14. The method of claim 1, wherein an upper boundary of the first band is 3 times greater than a lower boundary of the first band in the frequency domain.

15. The method of claim 1, wherein an upper boundary of the second band is 3 times greater than a lower boundary of the second band in the frequency domain.

16. The method of claim 1, wherein a frequency range of the second band is three times larger than a frequency range of the first band.

17. The method of claim 1, wherein the noise signal comprises at least one of a white noise signal and a pink noise signal.

18. A system for providing a noise signal comprising:
   a component for providing a first signal low, corresponding to a first band of a frequency spectrum of the noise signal, by creating the first signal low in the frequency domain and converting the first signal low into the time domain;
   a component for providing a first signal, corresponding to the first band of the frequency spectrum of the noise signal, by up-sampling the first signal low;
   a component for providing a second signal corresponding to a second band of the frequency spectrum of the noise signal, the second signal based on the first signal low; and
   a component for summing the first signal and the second signal to provide the noise signal.

19. The system of claim 18, wherein up-sampling the first signal low comprises using an interpolation filter.

20. The system of claim 19, wherein the interpolation filter utilizes at least one of the relations:

$$h_1(n) = \sin(\pi((1/3)-n))/\pi((1/3)-n)$$

$$h_2(n) = \sin(\pi((2/3)-n))/\pi((2/3)-n); \text{ and}$$

wherein $h_1(n)$ is used to generate a first interpolation point and $h_2(n)$ is used to generate a second interpolation point.

21. The system of claim 18, wherein creating the first signal low in the frequency domain comprises utilizing at least one of the relations:

$$\text{mag}(f) = 1/f^n, \text{ and power}(f) = 1/f^{2n}; \text{ and}$$

wherein mag(f) and power(f) are a magnitude and a power of a frequency component at frequency f respectively.

22. The system of claim 21, wherein the noise signal is a white noise signal if n=0.

23. The system of claim 21, wherein the noise signal is a pink noise signal if n=0.5.

24. The system of claim 18, wherein a Fourier transform is used in converting the first signal low into the time domain.

25. The system of claim 18, wherein the component for providing the second signal is further configured for creating the second signal in the time domain using the first signal low.

26. The system of claim 25, wherein creating the second signal in the time domain using the first signal low comprises:
   providing the first signal low corresponding to the first band of a frequency spectrum of the noise signal;
   providing a repeat signal comprising repeating the first signal low;
   providing a fill-in signal; and
   summing the repeat signal and the fill-in signal to provide the second signal.

27. The system of claim 26, wherein providing the fill-in signal comprises multiplying the repeat signal by a single frequency signal, the single frequency signal including only the frequency corresponding to the lowest frequency of the second band.

28. The system of claim 26, wherein summing the repeat signal and the fill-in signal to provide the second signal comprises scaling the second signal by a factor to match the spectrum of the first signal.

29. The system of claim 28, wherein the factor comprises $3^{-n}$.

30. The system of claim 18, wherein the first band and the second band are contiguous in the frequency domain.

31. The system of claim 18, wherein an upper boundary of the first band is 3 times greater than a lower boundary of the first band in the frequency domain.

32. The system of claim 18, wherein an upper boundary of the second band is 3 times greater than a lower boundary of the second band in the frequency domain.

33. The system of claim 18, wherein a frequency range of the second band is three times larger than a frequency range of the first band.

34. The system of claim 18, wherein the noise signal comprises at least one of a white noise signal and a pink noise signal.

35. A computer-readable medium on which is stored a set of instructions for providing a noise signal, which when executed performs stages comprising:
   providing a first signal low, corresponding to a first band of a frequency spectrum of the noise signal, by creating the first signal low in the frequency domain and converting the first signal low into the time domain;
   providing a first signal, corresponding to the first band of the frequency spectrum of the noise signal, by up-sampling the first signal low;
   providing a second signal corresponding to a second band of the frequency spectrum of the noise signal, the second signal based on the first signal low; and
   summing the first signal and the second signal to provide the noise signal.

36. The computer-readable medium of claim 35, wherein up-sampling the first signal low comprises using an interpolation filter.

37. The computer-readable medium of claim 36, wherein the interpolation filter utilizes at least one of the relations:

$$h_1(n) = \sin(\pi((1/3)-n))/\pi((1/3)-n)$$

$$h_2(n) = \sin(\pi((2/3)-n))/\pi((2/3)-n); \text{ and}$$

wherein $h_1(n)$ is used to generate a first interpolation point and $h_2(n)$ is used to generate a second interpolation point.

38. The computer-readable medium of claim 35, wherein creating the first signal low in the frequency domain comprises utilizing at least one of the relations:

$$\text{mag}(f) = 1/f^n, \text{ and power}(f) = 1/f^{2n}; \text{ and}$$

wherein mag(f) and power(f) are a magnitude and a power of a frequency component at frequency f respectively.

39. The computer-readable medium of claim 38, wherein the noise signal is a white noise signal if n=0.

40. The computer-readable medium of claim 38, wherein the noise signal is a pink noise signal if n=0.5.

41. The computer-readable medium of claim 35, wherein a Fourier transform is used in converting the first signal low into the time domain.

42. The computer-readable medium of claim 35, wherein providing the second signal comprises creating the second signal in the time domain using the first signal low.

43. The computer-readable medium of claim 42, wherein creating the second signal in the time domain using the first signal low comprises:
 providing the first signal low corresponding to the first band of a frequency spectrum of the noise signal;
 providing a repeat signal comprising repeating the first signal low;
 providing a fill-in signal; and
 summing the repeat signal and the fill-in signal to provide the second signal.

44. The computer-readable medium of claim 43, wherein providing the fill-in signal comprises multiplying the repeat signal by a single frequency signal, the single frequency signal including only the frequency corresponding to the lowest frequency of the second band.

45. The computer-readable medium of claim 43, wherein summing the repeat signal and the fill-in signal to provide the second signal comprises scaling the second signal by a factor to match the spectrum of the first signal.

46. The computer-readable medium of claim 45, wherein the factor comprises $3^{-n}$.

47. The computer-readable medium of claim 35, wherein the first band and the second band are contiguous in the frequency domain.

48. The computer-readable medium of claim 35, wherein an upper boundary of the first band is 3 times greater than a lower boundary of the first band in the frequency domain.

49. The computer-readable medium of claim 35, wherein an upper boundary of the second band is 3 times greater than a lower boundary of the second band in the frequency domain.

50. The computer-readable medium of claim 35, wherein a frequency range of the second band is three times larger than a frequency range of the first band.

51. The computer-readable medium of claim 35, wherein the noise signal comprises at least one of a white noise signal and a pink noise signal.

* * * * *